US012635531B2

(12) United States Patent
Li et al.

(10) Patent No.: US 12,635,531 B2
(45) Date of Patent: May 19, 2026

(54) POSITION SPECIFICATION METHOD, POSITION SPECIFICATION PROGRAM, AND INSPECTION APPARATUS

(71) Applicant: Hitachi High-Tech Corporation, Tokyo (JP)

(72) Inventors: Liang Li, Tokyo (JP); Kosuke Matsumoto, Tokyo (JP); Wei Chean Tan, Tokyo (JP); Kyo Ryo, Tokyo (JP); Junji Yamamoto, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 421 days.

(21) Appl. No.: 18/272,746

(22) PCT Filed: Feb. 26, 2021

(86) PCT No.: PCT/JP2021/007371
§ 371 (c)(1),
(2) Date: Jul. 17, 2023

(87) PCT Pub. No.: WO2022/180792
PCT Pub. Date: Sep. 1, 2022

(65) Prior Publication Data
US 2024/0304563 A1     Sep. 12, 2024

(51) Int. Cl.
H10W 46/00 (2026.01)
G06T 7/11 (2017.01)
(Continued)

(52) U.S. Cl.
CPC ............. H10W 46/00 (2026.01); G06T 7/11 (2017.01); G06T 7/66 (2017.01); G06T 7/74 (2017.01);
(Continued)

(58) Field of Classification Search
CPC ... H01L 2223/54426; G06T 7/70; G06T 7/11; G06T 7/74
See application file for complete search history.

(56) References Cited

U.S. PATENT DOCUMENTS

| | | | | |
|---|---|---|---|---|
| 2001/0019109 A1* | 9/2001 | Yamaguchi | ........... | H01J 37/222 250/311 |
| 2012/0182415 A1* | 7/2012 | Toyoda | ................... | G06T 7/001 348/80 |

(Continued)

FOREIGN PATENT DOCUMENTS

| | | |
|---|---|---|
| JP | 6-187450 A | 7/1994 |
| JP | 10-141920 A | 5/1998 |
| JP | 2001-243906 A | 9/2001 |
| JP | 2006-190078 A | 7/2006 |
| JP | 2011-81485 A | 4/2011 |

OTHER PUBLICATIONS

International Search Report (PCT/ISA/210) issued in PCT Application No. PCT/JP2021/007371 dated May 11, 2021 with English translation (4 pages).
(Continued)

*Primary Examiner* — Britt Hanley
*Assistant Examiner* — Victor V Barzykin
(74) *Attorney, Agent, or Firm* — Crowell & Moring LLP

(57) ABSTRACT

This disclosure is directed to a position specification method of specifying a position of a mark formed on a semiconductor wafer from an image of the semiconductor wafer using a computer system. The method includes a first procedure of setting a partial image region to an image, a second procedure of dividing the partial image region on the basis of a division index, and setting a part of a region of a first divided image as a reference image. The method also includes a third procedure of determining whether a mark exists in the partial image region. The method also includes a fourth procedure of calculating, when it is determined in (Continued)

the third procedure that a mark exists in the partial image region, a representative position of the mark in the partial image region.

13 Claims, 10 Drawing Sheets

(51) Int. Cl.
    *G06T 7/66*         (2017.01)
    *G06T 7/73*         (2017.01)

(52) U.S. Cl.
    CPC . *G06T 2207/30148* (2013.01); *H10W 46/301*
                                (2026.01)

(56)                       References Cited

U.S. PATENT DOCUMENTS

| | | | |
|---|---|---|---|
| 2018/0059533 A1* | 3/2018 | Du | G03F 1/36 |
| 2019/0187269 A1* | 6/2019 | Tong | G01S 7/003 |
| 2020/0335354 A1* | 10/2020 | Matsui | H01L 21/31116 |

OTHER PUBLICATIONS

Japanese-language Written Opinion (PCT/ISA/237) issued in PCT Application No. PCT/JP2021/007371 dated May 11, 2021 (4 pages).
Korean-language Office Action issued in Korean Application No. 10-2023-7023092 dated Oct. 16, 2025, with English translation (14 pages).

\* cited by examiner

[FIG. 1]
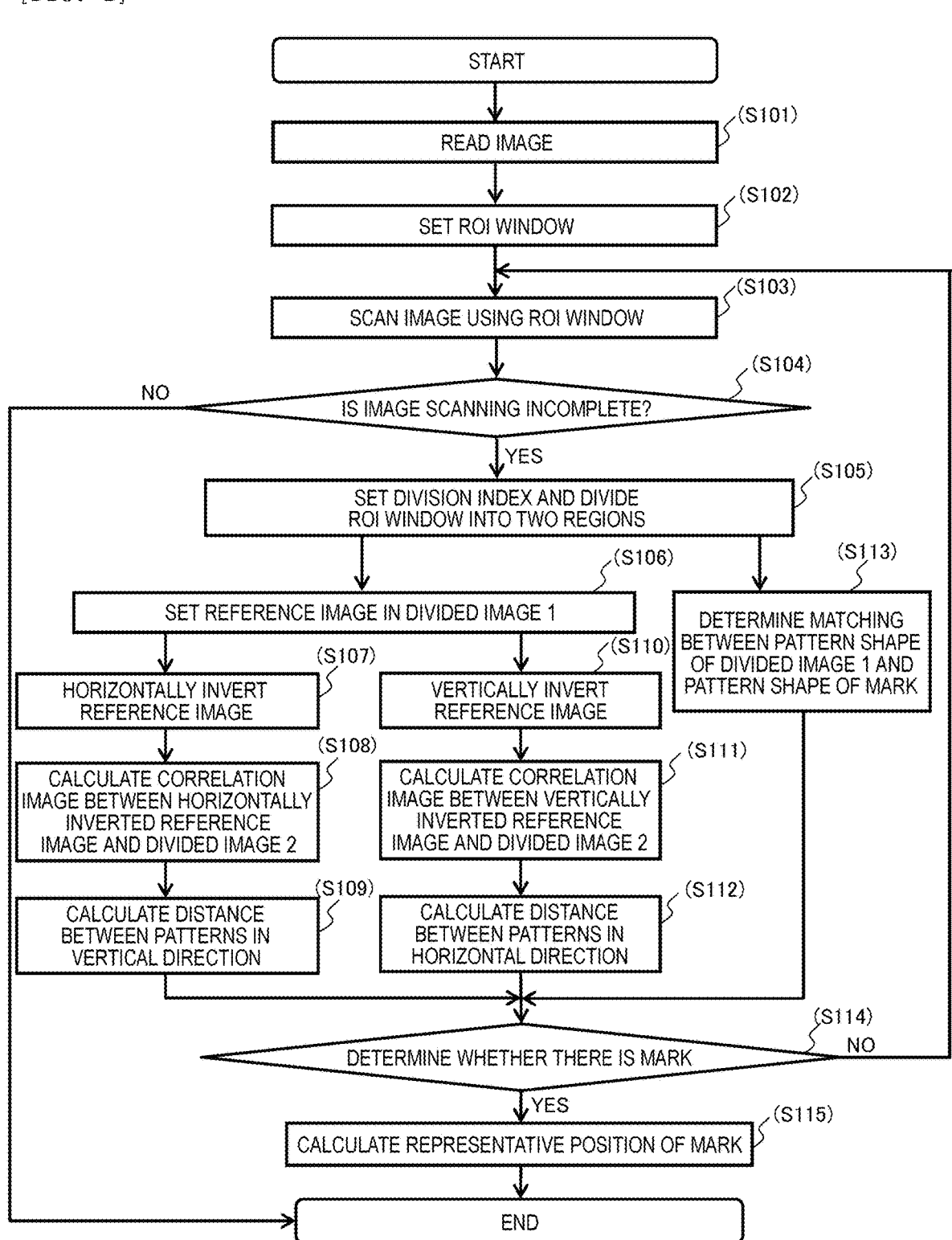

[FIG. 2]
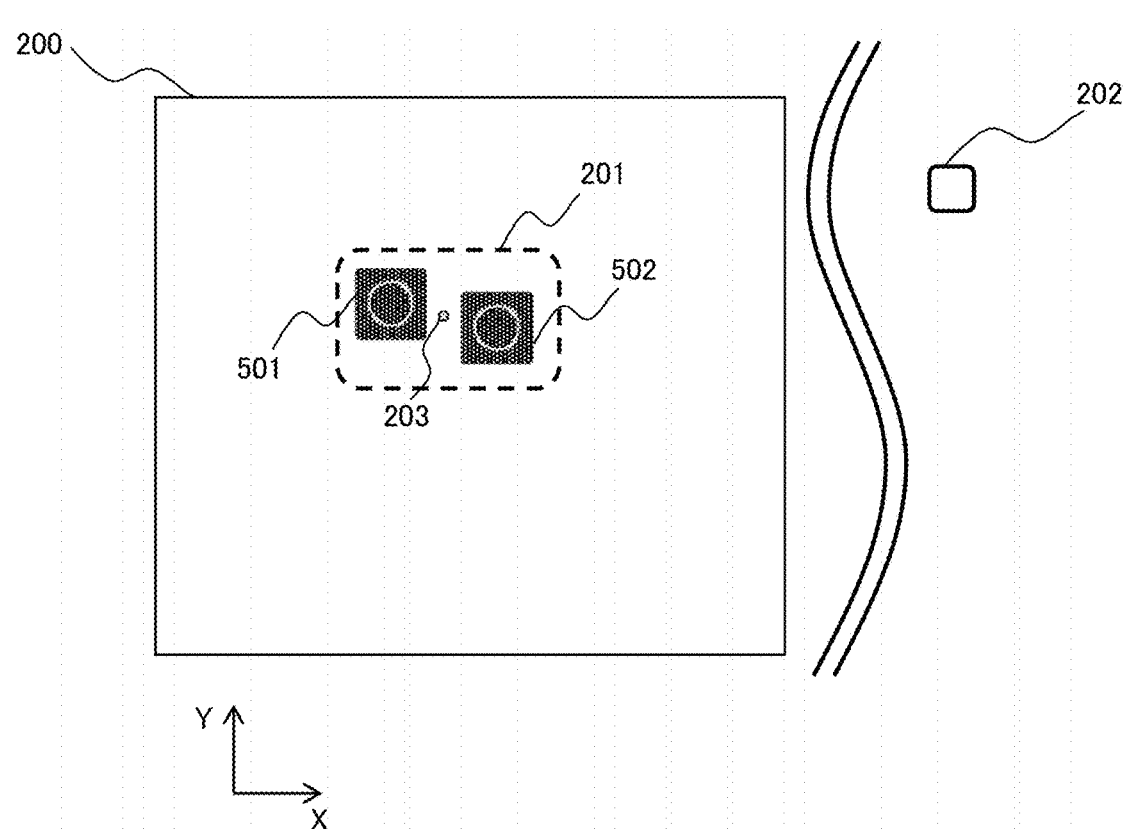

[FIG. 3]
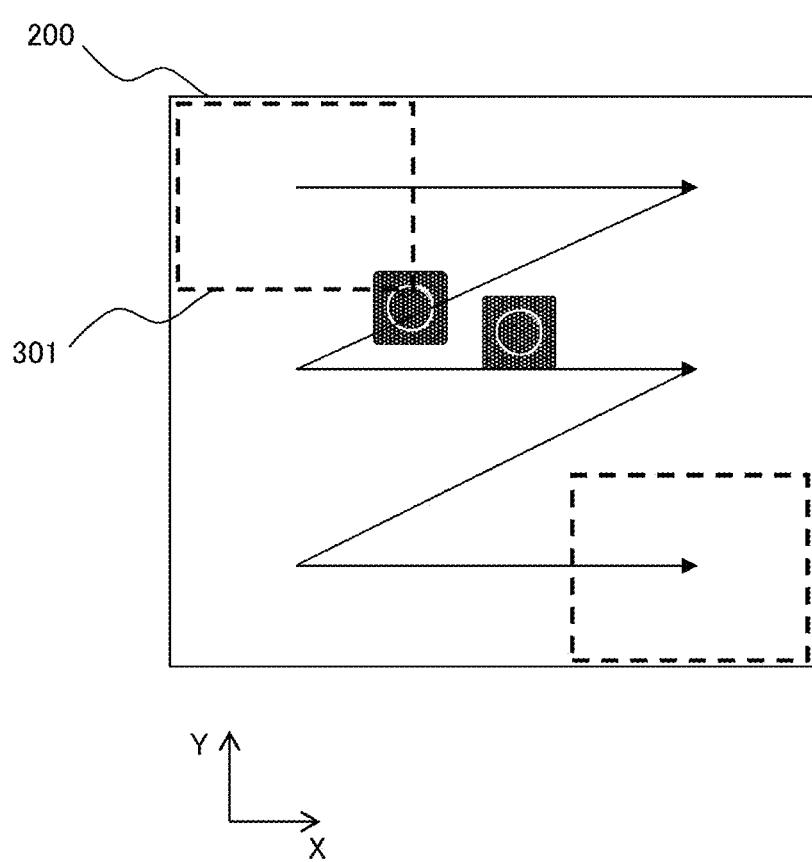
[FIG. 4]
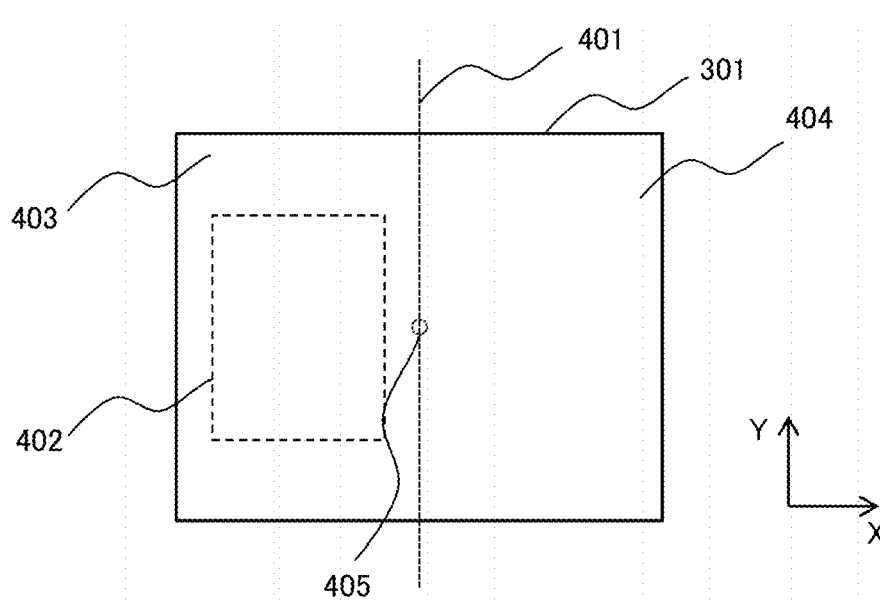

[FIG. 5A]
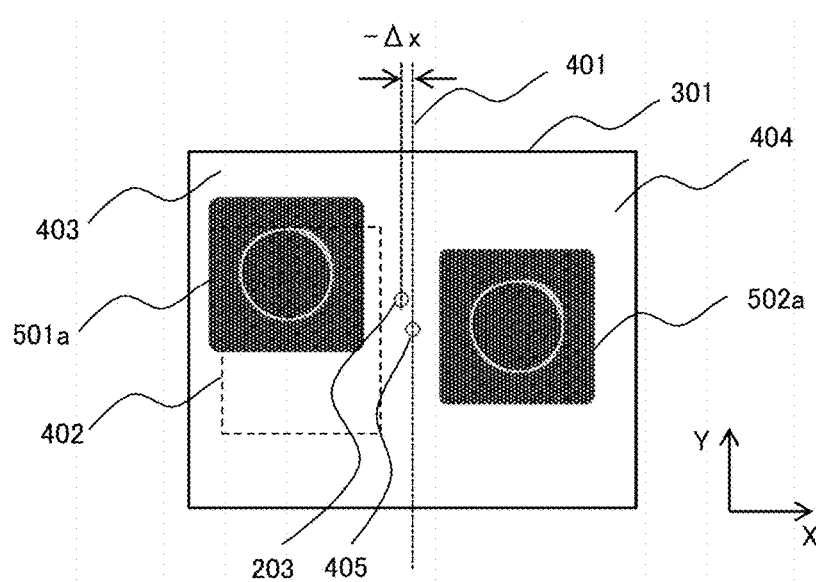
[FIG. 5B]
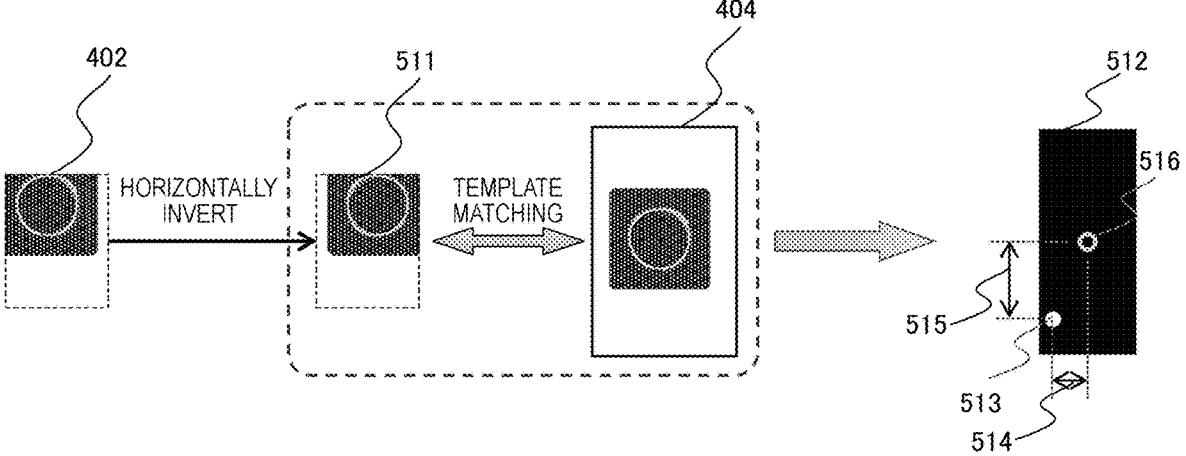

[FIG. 5C]
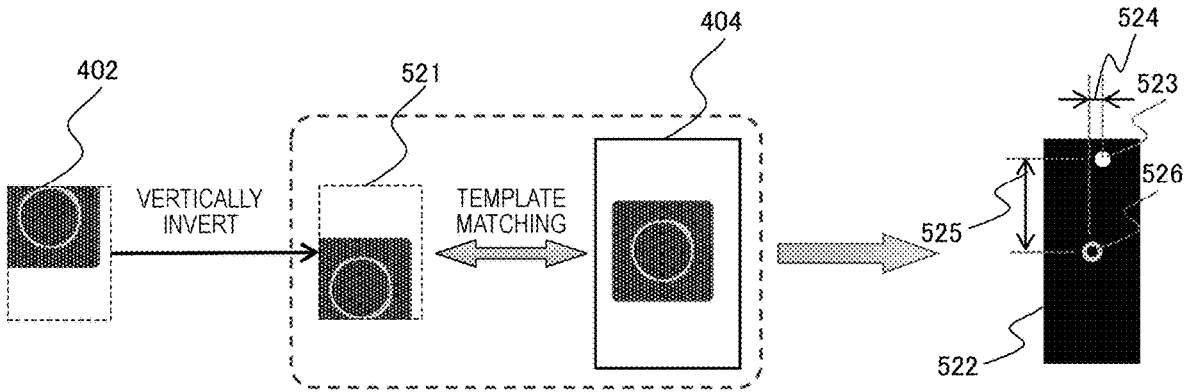
[FIG. 6]
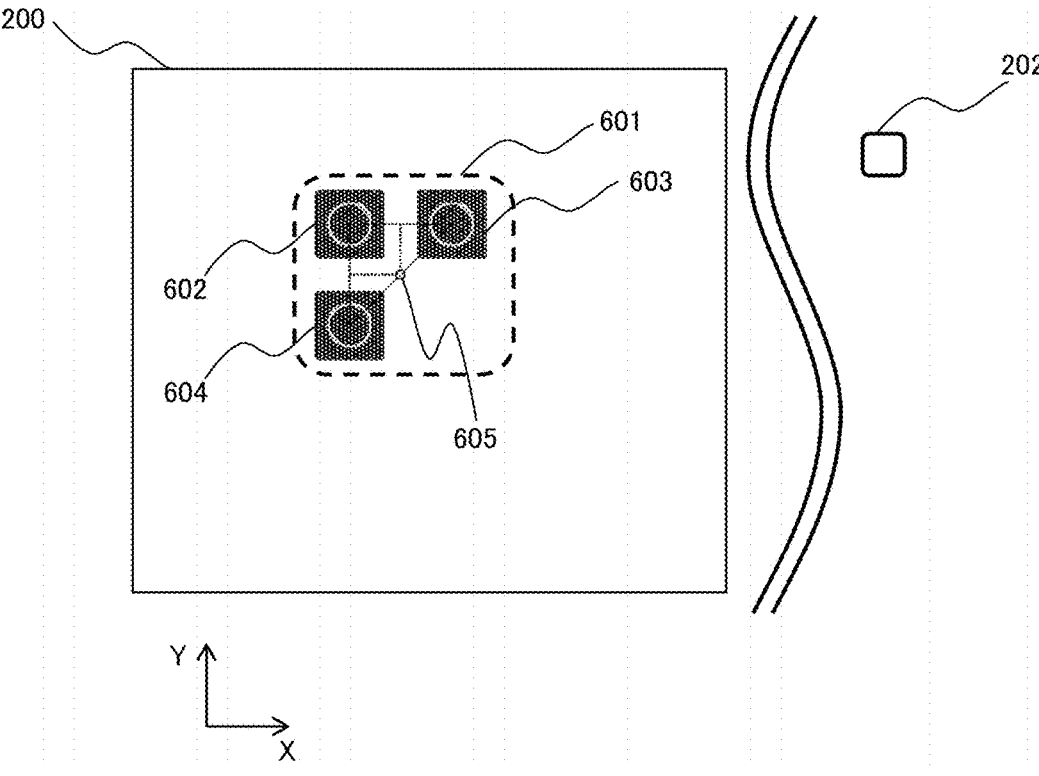

[FIG. 7]
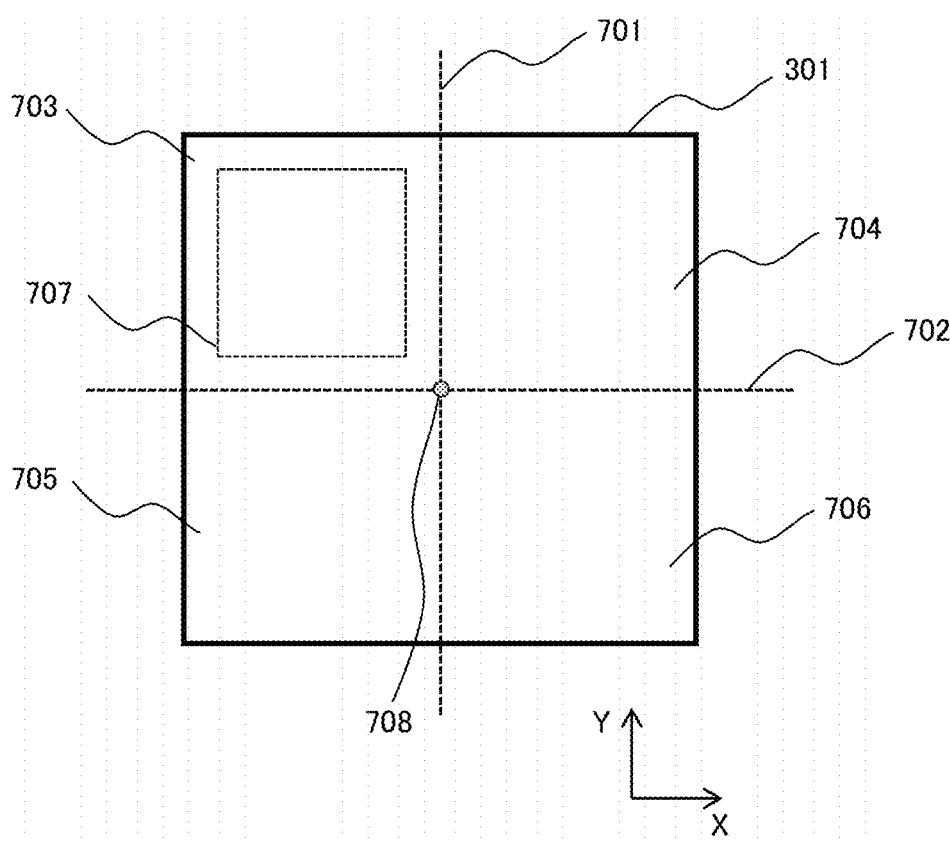
[FIG. 8A]
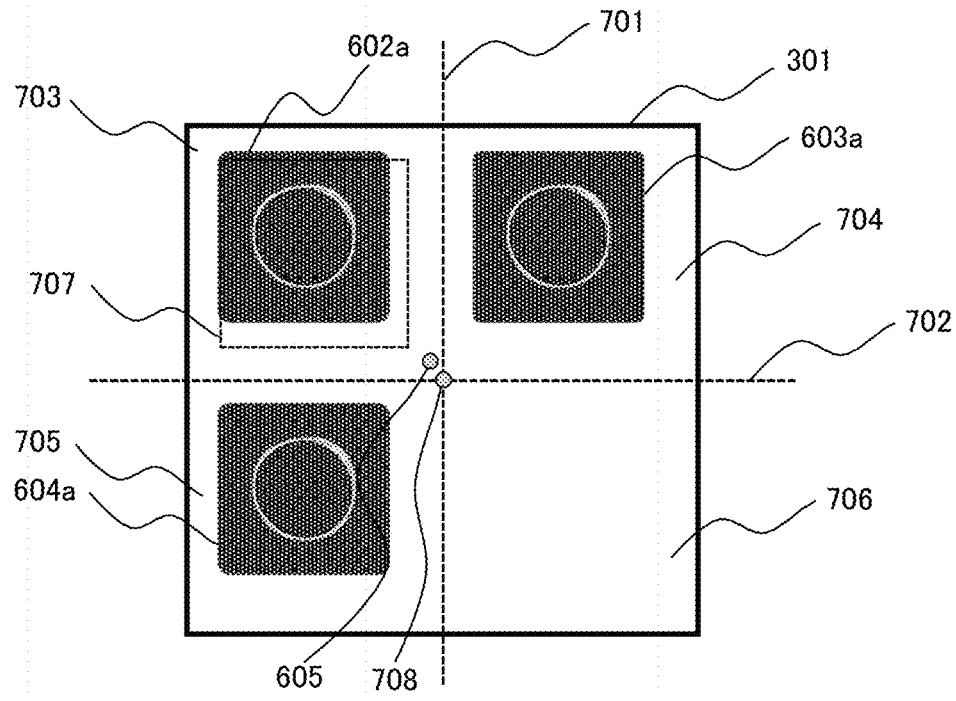

[FIG. 8B]
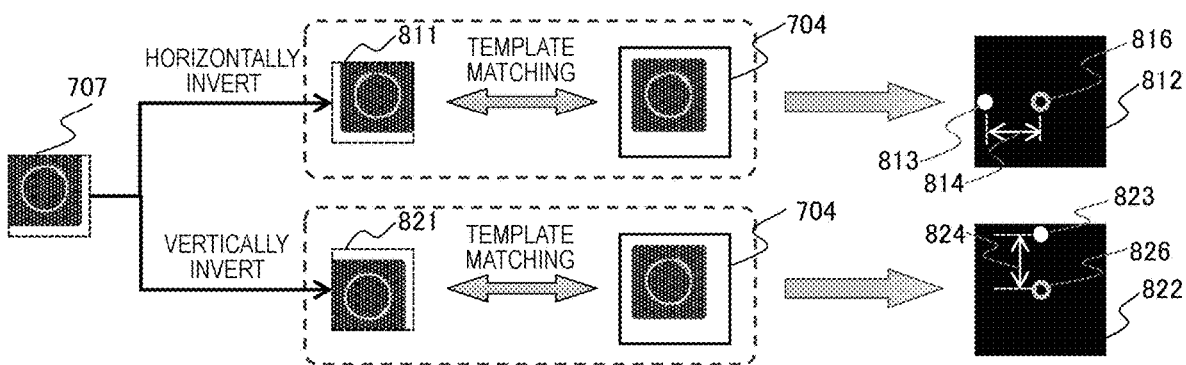
[FIG. 8C]
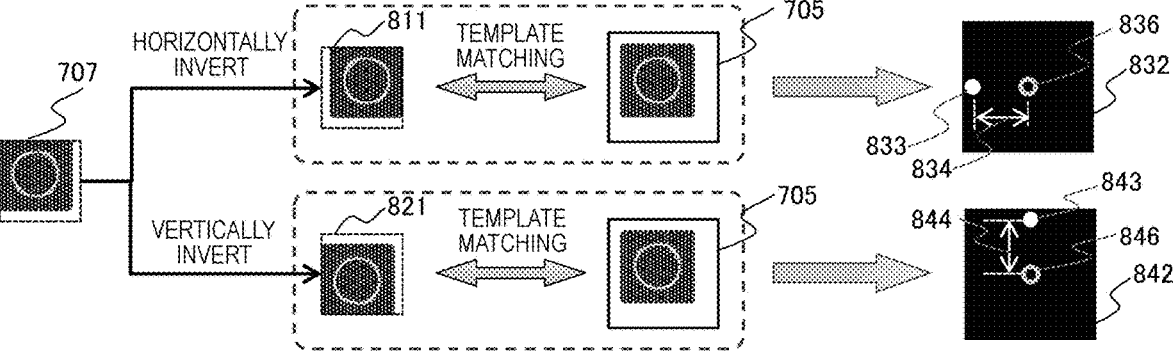
[FIG. 8D]
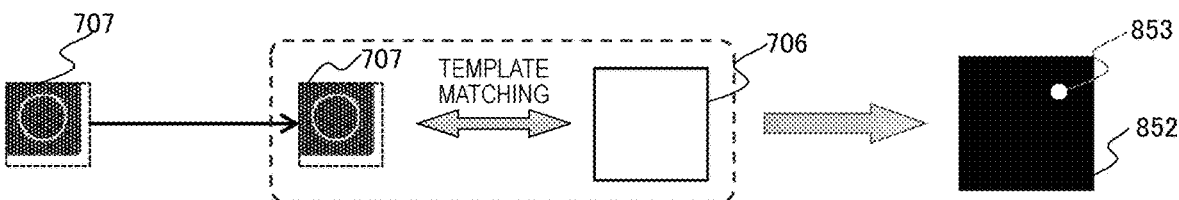

[FIG. 9]
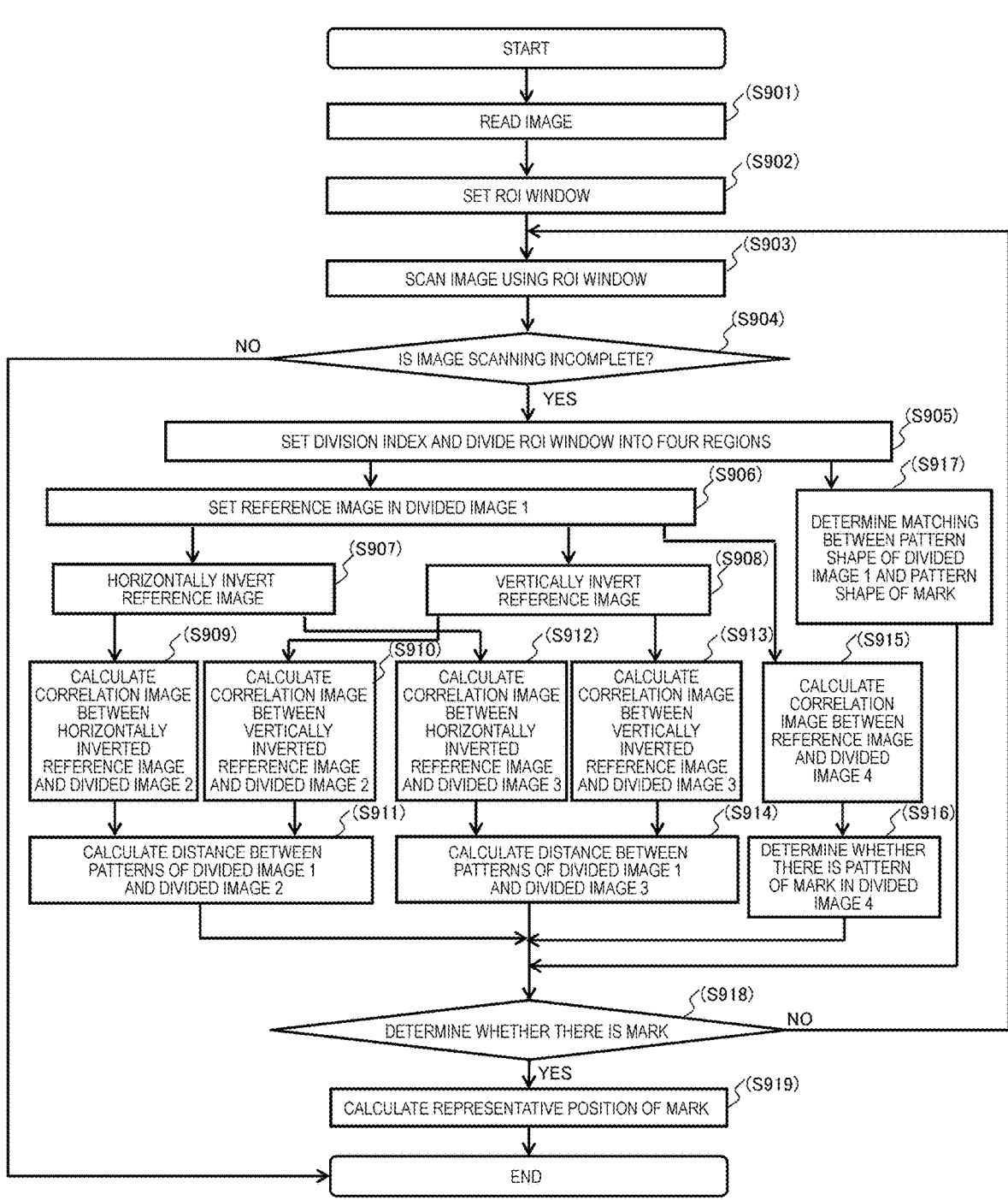

[FIG. 10]
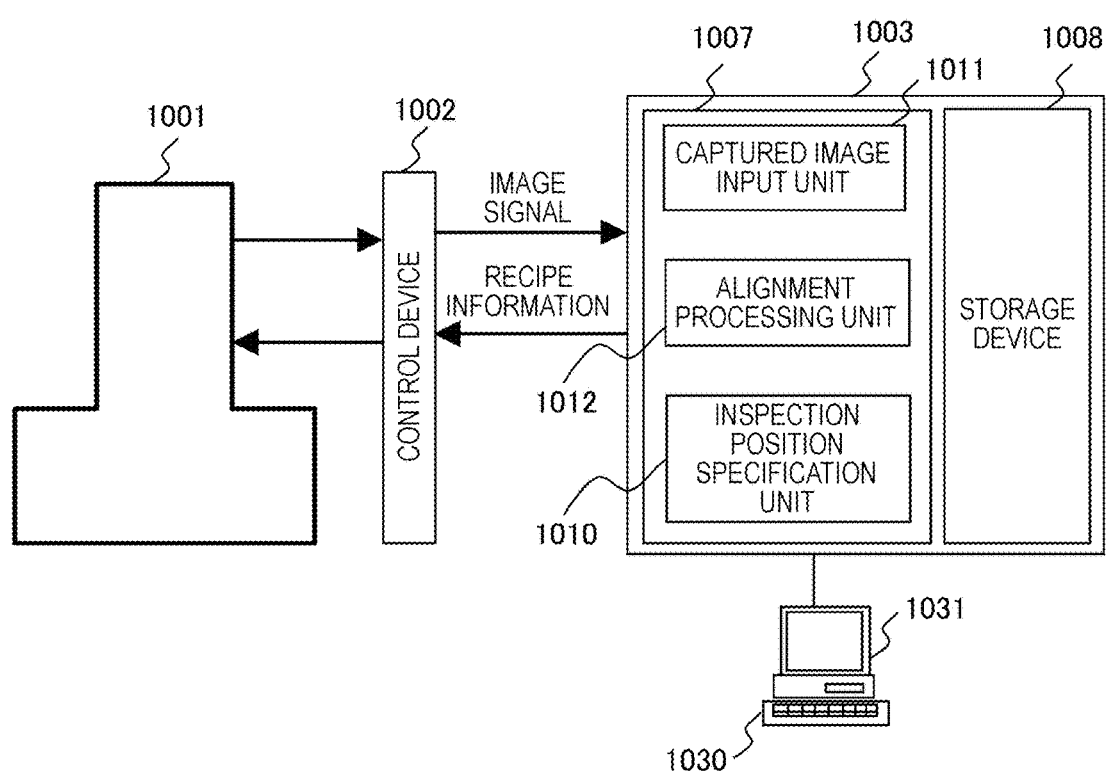

[FIG. 11]
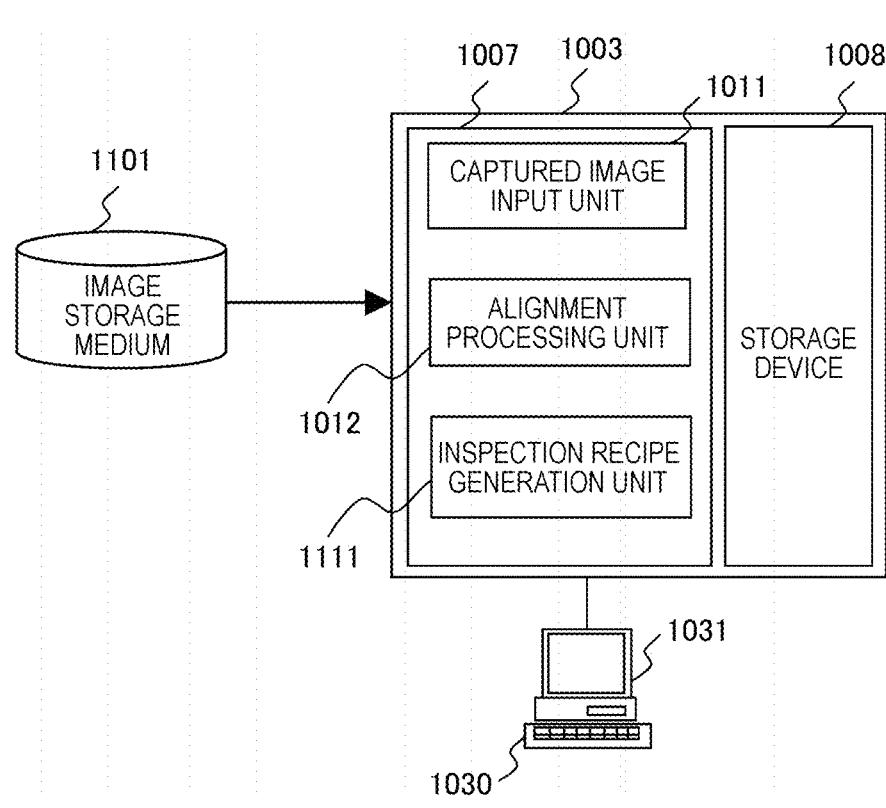

POSITION SPECIFICATION METHOD, POSITION SPECIFICATION PROGRAM, AND INSPECTION APPARATUS

TECHNICAL FIELD

The present disclosure relates to a position specification method, a position specification program, and an inspection apparatus.

BACKGROUND ART

Apparatuses that measure and inspect patterns formed on semiconductor wafers (hereinafter measuring and inspecting are collectively referred to as inspecting unless otherwise mentioned) use template matching technologies to align fields of vision of inspection apparatus with desired inspection positions in many cases.

General template matching technologies in semiconductor inspection apparatuses are technologies for detecting patterns matching template images prepared in advance from images captured by apparatuses through image processing. In this case, it is necessary to prepare the template images in advance. For example, in semiconductor wafers, alignment marks configured with specific patterns are formed to specify inspection positions. Image of alignment marks captured in advance by inspection apparatuses, images generated from design data of alignment marks, or the like are registered in advance as template images in the inspection apparatuses.

As the alignment marks, for example, marks in which patterns with symmetry to horizontal lines, vertical lines, or the like are configured in special dispositions are used in many cases.

CITATION LIST

Patent Literature

PTL 1: JP2001-243906A
PTL 2: JP2011-81485A

SUMMARY OF INVENTION

Technical Problem

As patterns become miniature or 3-dimensional, the number of process steps have increased yearly and patterning content are re-examined in the same steps in some cases. In schemes of registering template images in advance for alignment, it is necessary to re-register the template images each time processes are added or re-examined. Therefore, labor and time for generating inspection recipes indicating inspection procedures of semiconductor wafers have increased. PTL 1 discloses a scheme of reducing a burden on generation of a template image by generating a template image simulatively while focusing on regularity of patterns.

However, a problem arising in alignment performed using a pre-registered template image is a deterioration in accuracy of template matching or a failure of the template matching when a way to view alignment marks are considerably different in steps. By adding a layer to a semiconductor wafer for each step or forming a pattern by etching, for even a captured image of the same alignment mark, a difference in a way to view a captured image can be likely to arise when the step is different. In this case, it is necessary to re-register a template image suitable for a way to view a mark, and thus labor and time are taken and there is also an influence on an operation rate of an inspection apparatus.

PTL 2 discloses a scheme of extracting image regions of some of captured images, setting divided images of the image regions (evaluation windows) as template images, and performing pattern matching while rotating the template images. Since template images are not used, labor and time for registering template images in advance are not necessary, and thus there is no problem in the difference in the way to view in steps. However, since cross points of scribe lines are assumed as point-symmetric patterns to be detected, there is a limitation on accuracy of specifiable pattern positions. When magnification in inspection is high, alignment is performed step by step from low magnification to high magnification in some cases. However, when alignment accuracy at low magnification is low and the magnification is increased, a desired field of vision may be likely to deviate from a field of vision of the inspection apparatus. Therefore, high accuracy is required in an alignment process.

The present disclosure includes a position specification method of specifying a position of an alignment mark formed on a semiconductor wafer with high accuracy. By applying the position specification method disclosed in the present specification, it is possible to specify a position of an alignment mark with high accuracy without using a pre-registered template image in an inspection stage. Alternatively, even when the alignment process is performed using the pre-registered template image in the inspection stage, an image of an alignment mark used for the template image can be automatically cut from an image of the semiconductor wafer. Therefore, it is possible to considerably reduce a burden on generation of a template image to be registered.

Solution to Problem

According to an aspect of the present disclosure, there is provided a position specification method of specifying a position of a mark formed on a semiconductor wafer from an image of the semiconductor wafer using a computer system. The mark has at least a first pattern and a second pattern, and the first and second patterns have an identical shape which is line-symmetric with respect to a first axis and a second axis that are orthogonal to each other, and are disposed to be point-symmetric.

The position specification method includes: a first procedure of setting a partial image region in the image; a second procedure of dividing the partial image region into a first divided image and a second divided image based on a division index and setting a partial region of the first divided image as a reference image; a third procedure of determining whether the mark is in the partial image region; and a fourth procedure of calculating a representative position of the mark in the partial image region when the mark is determined to be in the partial 1 image region in the third procedure and calculating the representative position of the mark in the image based on a position of the partial image region in the image and the calculated representative position of the mark in the partial image region.

In the third and fourth procedures, it is determined whether the mark is in the partial image region and the representative position of the mark in the partial image region is calculated based on a template matching result obtained by performing template matching between a template image which is based on the reference image and the second divided image which is a searching target image.

Advantageous Effects of Invention

Even when a way to view an alignment mark in a captured image is considerably different, a position of a mark can be stably specified. Other problems and novel features are apparent from description of the present specification and the appended drawings.

BRIEF DESCRIPTION OF DRAWINGS

FIG. 1 is a flowchart illustrating an alignment process according to Embodiment 1.

FIG. 2 is an image (a schematic view) obtained by imaging a semiconductor wafer.

FIG. 3 is a diagram illustrating a region of interest (ROI) window.

FIG. 4 is a diagram illustrating a division index and a reference image set in the ROI window.

FIG. 5A is a diagram illustrating a position specification method according to Embodiment 1.

FIG. 5B is a diagram illustrating the position specification method according to Embodiment 1.

FIG. 5C is a diagram illustrating the position specification method according to Embodiment 1.

FIG. 6 is an image (a schematic view) obtained by imaging a semiconductor wafer.

FIG. 7 is a diagram illustrating a division index and a reference image set in the ROI window.

FIG. 8A is a diagram illustrating a position specification method according to Embodiment 2.

FIG. 8B is a diagram illustrating the position specification method according to Embodiment 2.

FIG. 8C is a diagram illustrating the position specification method according to Embodiment 2.

FIG. 8D is a diagram illustrating the position specification method according to Embodiment 2.

FIG. 9 is a flowchart illustrating an alignment process according to Embodiment 2.

FIG. 10 is a diagram illustrating a configuration example of an inspection apparatus.

FIG. 11 is a diagram illustrating a configuration example of an inspection recipe generation apparatus.

DESCRIPTION OF EMBODIMENTS

FIG. 10 is a diagram illustrating a configuration example of an inspection apparatus. The inspection apparatus in FIG. 10 is an apparatus that inspects a semiconductor wafer using a scanning electron microscope (SEM). For example, an SEM type inspection apparatus acquires an image of a minute pattern of a semiconductor device formed on a semiconductor wafer and measures dimensions of the minute pattern. The inspection apparatus includes an SEM body 1001, a control device 1002 that controls the SEM body 1001, a computer system 1003 that performs an alignment process, an input device 1030 that inputs information necessary for the computer system 1003, and a display 1031 that displays an information input screen, an inspection result, and the like. The inspection apparatus includes an optical microscope capable of acquiring an image of a large field of vision to perform an alignment process at low magnification. The inspection apparatus is not limited to an SEM type inspection apparatus and may be a dark field optical inspection apparatus.

The computer system 1003 includes a calculation processing unit 1007 that includes one or more central processing units (CPUs), and a storage device 1008. In the present disclosure, the storage device 1008 stores a program related to the alignment process, a program related to other SEM control, data used for the process of these programs, for example, image data, processing results by these programs such as inspection recipes, and the like. The computer system 1003 may be configured integrally with the control device 1002.

By causing the calculation processing unit 1007 to execute the program related to the alignment process, an alignment process to be described below is performed. That is, the computer system 1003 functions as an alignment processing apparatus. In other words, the program causes the computer system to function as the alignment processing apparatus. A program executed by the computer system 1003 or the like and a function thereof are referred to as "a function", a "unit", or the like.

The calculation processing unit 1007 functions as a captured image input unit 1011 which is an interface to which a captured image by the SEM body 1011 or an optical microscope is input, an alignment processing unit 1012 that performs an alignment process in accordance with the image input by the captured image input unit 1011, and an inspection position specification unit 1010 that specifies an inspection position by a representative position of a mark calculated by the alignment processing unit 1012. A process of the alignment processing unit 1012 will be described in detail with reference to the following embodiments.

Embodiment 1

FIG. 1 is a flowchart illustrating an alignment process according to Embodiment 1. When an inspection apparatus inspects a pattern formed on a semiconductor wafer, it is necessary to specify an inspection position accurately. Therefore, an alignment mark with a specific pattern is formed on the semiconductor wafer. The inspection apparatus first searches for a position of the mark and moves a field of vision from the mark to the inspection position. A distance between the mark and the inspection position is known in the specification of the semiconductor wafer. Therefore, when the mark can be ascertained centering on the field of vision accurately, the inspection position can be ascertained centering on the field of vision accurately. A process of specifying the position of the mark on the semiconductor wafer is referred to as an alignment process. Hereinafter, an overview of each step will be described.

(Step S101)

The calculation processing unit 1007 acquires an image obtained by imaging the semiconductor wafer by the captured image input unit 1011. It is assumed that an alignment mark is shown in the image. Features of the alignment mark used in Embodiment 1 will be described below with reference to FIG. 2.

(Step S102)

The alignment processing unit 1012 sets a region of interest (ROI) window in the acquired image. The ROI window will be described below with reference to FIGS. 3 and 4.

(Steps S103 to S104)

The alignment processing unit 1012 determines whether the alignment mark is in the ROI window. When the alignment mark is determined to be in the ROI window, the alignment processing unit 1012 attempts to calculate the representative position of the alignment mark. This process is repeated while moving (scanning) the ROI window until the process succeeds. When the scanning is completed in the entire region of the image, the alignment process ends.

(Steps S105 to S114)

The steps are a procedure of determining whether the alignment mark is in the ROI window. The details of the procedure will be described with reference to FIGS. 5A to 5C. When the alignment mark is determined to be in the ROI window, the process proceeds to step S115. When the alignment mark is determined not to be in the ROI window, the ROI window is moved (step S103) and it is repeatedly determined whether the alignment mark is in a new image region of the ROI window.

(Step S115)

The alignment processing unit 1012 calculates the representative position of the mark. The details of the representative position will be described below with reference to FIGS. 5A to 5C.

Hereinafter, details of each step will be described.

FIG. 2 is an image 200 obtained by imaging the semiconductor wafer and input to the alignment processing apparatus. In the image 200, an alignment mark 201 is shown. The alignment processing apparatus accurately obtains a representative position 203 of the mark 201 in the image 200. The inspection apparatus accurately specifies a position of an inspection point 202 based on the position and performs inspection. The mark 201 includes two patterns 501 and 502.

Here, the patterns 501 and 502 have an identical shape. In the patterns used in the mark 201, a circular contour is included in a square contour and the center of the square contour matches the center of the circular contour, but the present disclosure is not limited to the patterns. The patterns used in the mark 201 only need to have a shape which is line-symmetric with respect to two axes that are orthogonal to each other. The orthogonal symmetric axes of the patterns are defined as an X axis and a Y axis. The shapes of the patterns preferably include a rectangle or a cross shape so that the symmetric axes can be ascertained from the pattern shapes. The patterns may or may not be combinations of a plurality of shapes. However, by combining the plurality of shapes, comparison portions of the patterns can be increased. Therefore, in template matching to be described below, matching with high accuracy can be expected. The mark 201 including the patterns 502 and 501 is formed in a shape which is point-symmetric using the representative position 203 as a center of the symmetry.

A broken line indicating the mark 201 illustrated in FIG. 2 and a point of the representative position 203 are shown in the drawing to illustrate the mark 201 and the representative position 203 of the mark explicitly, but are not actually shown in an actual semiconductor wafer or the image 200.

FIG. 3 is a diagram illustrating an ROI window (a partial image region) for specifying a mark from the image 200. The alignment processing unit 1012 sets a partial region of the image 200 as an ROI window 301. The ROI window is obtained by cutting a rectangular region in the image 200. Two sides of the rectangle are parallel to the X and Y axes, respectively. Here, the shape of the ROI window 301 is rectangular, but the present disclosure is not limited thereto. A size in which both two patterns included in the mark 201 are included in the ROI window 301 is necessary, but may not be a size completely including the two patterns. The size may be a size in which the representative position 203 of the mark 201 can be detected using the ROI window 301 to be described below with predetermined accuracy.

The shape and the size of the ROI window 301 may be generated in accordance with the mark 201 by the calculation processing unit 1007 or may be input from the input device 1030 by an operator (step S102). The alignment processing unit 1012 determines whether the mark 201 is in the ROI window 301 while scanning the ROI window 301 in the image 200. When the mark 201 is determined to be in the ROI window 301, the representative position 203 of the mark 201 is calculated. That is, it is determined whether the mark 201 is inside the ROI window 301 obtained by cutting a part of the image 200 without detecting the mark 201 from the entire image 200. When a positive result is obtained, the representative position of the mark 201 is further calculated.

The alignment processing unit 1012 scans the entire image 200 while shifting the ROI window 301 (step S103).

An initial position of the ROI window 301 is assumed to be the top left vertex of the image 200. The alignment processing unit 1012 first moves the ROI window 301 by several pixels to the right (in the X direction) to scan the image 200. When a scanning position of the ROI window 301 reaches the right end, the scanning position is moved to the lower side (in the Y direction) by several pixels to perform scanning from the left to the right of the image 200 again. The alignment processing unit 1012 scans the entire image 200 by repeating a similar procedure.

As will be described below, when the representative position 203 of the mark 201 is calculated, matching between the central position of the ROI window 301 and the representative position of the mark 201 is not required. Since a positional relationship only needs to be established so that the mark 201 is approximately included in the ROI window 301, a movement interval in the X or Y direction in the scanning of the ROI window may not be one pixel. By enlarging the movement interval, the number of times the ROI window 301 is acquired and a mark searching process can be reduced. Therefore, there is an advantageous effect of shortening a scanning time. When the mark 201 is specified, the scanning of the ROI window 301 may end and it is not necessary to scan the entire image 200.

The scanning may not be performed in the above-described order (from the top left to the bottom right). For example, the ROI window 301 is gradually moved from a position where a probability of the mark 201 being statistically located is high to a periphery and the entire image 200 may be scanned. In accordance with any scanning method, a processing time can be shortened as long as the number of times of the process of the ROI window 301.

FIG. 4 is a diagram illustrating a division index for dividing the ROI window 301 and a reference image. The alignment processing unit 1012 divides the ROI window 301 into two image regions (a left divided image 403 and a right divided image 404) using the division index 401 (step S105). Here, the division index 401 is a vertical line (parallel to the Y axis) passing through a central position 405 of the ROI window 301. The division index 401 may be set as a straight line parallel to any symmetric axis of the patterns so that one of the two patterns can be included in one divided image and the other of the two patterns can be included in the other divided image. Depending on a positional relationship between the patterns 501 and 502, the division index 401 parallel to the X axis can also be taken. The division index 401 may not pass through the central position 405 of the ROI window 301.

A smaller image region is cut from any of the two divided images (in the example of FIG. 4, the left divided image 403) and is set as a reference image 402 (step S106). Here, a central position of the reference image 402 is set to match a central position of the left divided image 403 and a position of the reference image is not particularly limited as long as the position is within an image region of the divided image. A setting of the division index 401 and the reference image 402 may be generated in accordance with the mark 201 by the calculation processing unit 1007 or may be input from the input device 1030 by the operator.

FIG. 5A is a diagram illustrating a state in which the ROI window 301 is moved to the vicinity of the mark 201. In the example of FIG. 5A, the representative position 203 of the mark 201 slightly deviates from the central position 405 of the ROI window 301.

FIG. 5B is a diagram illustrating a calculation procedure of a horizontal correlation image 512 from an image of the ROI window 301 illustrated in FIG. 5A.

First, an image obtained by inverting the reference image 402 with reference to the vertical axis (the Y axis) is referred to as a horizontally inverted reference image 511 (step S107). Subsequently, template matching is performed on the horizontally inverted reference image 511 and the right divided image 404 to calculate the horizontal correlation image 512 (step S108). The horizontal correlation image 512 is an image in which correlation values between a template image (the horizontally inverted reference image 511) and a searching target image (the right divided image 404) are arranged across the entire searching target image (the right divided image 404). Accordingly, when a size of the template image is a×b pixels and a size of the searching target image is m×n pixels, a size of the correlation image is (m−a+1)×(n−b+1) pixels.

Specifically, an image of a region with the same size as the template image is cut from the searching target image and the correlation values between the cut image and the template image are obtained. The cut image is cut by performing raster scanning on the searching target image (sliding window). An image in which the obtained correlation values are arranged as pixel values for each displacement (slide) of the cut image in the X direction and for each displacement (slide) of the cut image in the Y direction is referred to as a correlation image. The correlation values are calculated so that the correlation values are higher as the template image further matches the cut image. Accordingly, as illustrated in FIG. 5B, in a position where correlation between the searching target image and the cut image is higher, the pixel values are larger (brightness values are larger). In a position where the correlation is lower, the pixel values are smaller (brightness values are smaller). The brightness values may be smaller in the position where a correlation is higher. The brightness values may be larger in a position where the correlation is smaller.

To calculate the correlation values between the patterns with high accuracy, preprocessing may be performed on the template image and the searching target image. Examples of schemes for the preprocessing include image noise removing.

FIG. 5C is a diagram illustrating a calculation procedure of a vertical correlation image 522 from the image of the ROI window 301 illustrated in FIG. 5A. In this case, an image obtained by inverting the reference image 402 with respect to the horizontal axis (the X axis) is referred to as a vertically inverted reference image 521 (step S110) and the template matching is performed on the vertically inverted reference image 521 and the right divided image 404 to calculate the vertical correlation image 522 (step S111). A method of calculating the vertical correlation image 522 is the same as the method of calculating the horizontal correlation image 512, and thus repeated description will be omitted.

Next, a procedure of determining whether the mark 201 is in the ROI window 301 (step S114) will be described.

This determination procedure includes determination for the following four determination conditions. The four determination conditions are 1) determination of whether an identical pattern is in two divided images of the ROI window, 2) determination for a distance between the patterns detected in the horizontally divided images in the vertical direction, 3) determination for a distance between the patterns detected in the horizontally divided images in the horizontal direction, and 4) determination of whether a shape of a pattern detected in the ROI window matches a shape of a pattern of the mark 201.

1) Determination of Whether Identical Pattern is in Two Divided Images of ROI Window This determination is performed on a brightness value of a maximum brightness point of the horizontal correlation image 512 (or the vertical correlation image 522).

In order to obtain the maximum brightness point and the brightness value more precisely, it is preferable to estimate the maximum brightness point in units of sub-pixels. In order to estimate the maximum brightness point in units of sub-pixels, for example, correlation values between pixels can be interpolated, for example, by expressing correlation values obtained in units of pixels in the horizontal correlation image 512 in a continuous fitting function that has a pixel position as a variable, and a sub-pixel position at which a maximum value (or a minimum value) of the fitting function is given can be obtained as maximum brightness point. A scheme of obtaining the maximum brightness point and the brightness value of the maximum brightness point in units of sub-pixels of the correlation image is not limited to the above-described scheme.

When the brightness value of the maximum brightness point of the horizontal correlation image 512 exceeds a preset threshold (a determination reference), it can be determined that a pattern 501a included in the reference image 402 is identical with a pattern 502a included in the right divided image 404. The determination scheme is not limited to the determination performed with the threshold, but it may be determined whether the pattern included in the reference image 402 is identical with the pattern included in the right divided image 404 based on the correlation image.

2) Determination for Distance Between Patterns Detected in Respective Horizontally Divided Images in Vertical Direction In the example of FIG. 5A, the distance between the patterns in the vertical direction (the Y direction) is a distance between a center of the pattern 501a of the left divided image 403 and a center of the pattern 502a of the right divided image 404 in the Y direction. Here, the centers of the patterns are used as references for obtaining the distance, but the centers may not be used as long as the same positions in the patterns are used. The distance between the patterns in the vertical direction can be calculated from the horizontal correlation image 512.

In this example, the division index 401 is set to pass through the central position 405 of the ROI window and the central position of the reference image 402 is set at the central position of the left divided image 403. Therefore, when the position of the pattern 501 in the left divided image 403 and the position of the pattern 502 in the right divided image 404 are at the same position and the central position of the reference image 402 (the template image) matches the central position of the right divided image 404 (the searching target image), the correlation value is the maximum. That is, when the position of the pattern 501 in the left divided image 403 and the position of the pattern 502 in the right divided image 404 do not deviate either in the vertical direction (the Y direction) or in the horizontal direction (the X direction), the central position of the horizontal correlation image 512 is a maximum brightness point.

By using this, the distance between the patterns in the vertical direction (the Y direction) is obtained as a distance 515 between a position of a maximum brightness point 513 in the horizontal correlation image 512 and a position of a center 516 in the horizontal correlation image 512 (step S109). It is determined whether the distance in the vertical direction (the Y direction) obtained in this way is the same as a distance between the patterns 501 and 502 in the alignment mark 201 in the vertical direction (the Y direction).

In this example, the division index and the reference image are set as described above. Therefore, a maximum brightness point in a case where the position of the pattern 501 in the left divided image 403 and the position of the pattern 502 in the right divided image 404 do not deviate either in the vertical direction (the Y direction) or the horizontal direction (the X direction) can be obtained simply as a central position in the horizontal correlation image 512. When a method of setting at least one of the division index and the reference image is different, a maximum brightness point in a case where the positions do not deviate is calculated and the distance is obtained based on a distance between the maximum brightness point in the case where the positions do not deviate and the maximum brightness point in the correlation image.

3) Determination for Distance Between Patterns Detected in Respective Horizontally Divided Images in Horizontal Direction In the example of FIG. 5A, the distance between the patterns in the horizontal direction (the X direction) is a distance between the center of the pattern 501a of the left divided image 403 and the center of the pattern 502a of the right divided image 404 in the X direction. Here, the center of the pattern is used as the reference for obtaining the distance. However, as in the case of the vertical direction, the center may not be used as long as the same positions in the patterns are used. The distance between the patterns in the horizontal direction can be calculated from the vertical correlation image 522.

A distance 524 between a position of the maximum brightness point 523 in the vertical correlation image 522 and a position of a center 526 in the vertical correlation image 522 in the horizontal direction is a deviation amount between the center of the pattern 501a and the center of the pattern 502a in the horizontal direction when the left divided image 403 and the right divided image 404 are arranged in the vertical direction. Accordingly, the distance between the center of the pattern 502a and the division index 401 is doubled. Thus, by adding or subtracting the calculated deviation amount in a direction of the deviation, the distance between the patterns in the horizontal direction (the X direction) is obtained (step S112). It is determined whether the distance in the horizontal direction (the X direction) obtained in this way is the same as the distance between the patterns 501 and 502 in the mark 201 in the horizontal direction (the X direction).

In the embodiment, as will be described below, in order to calculate the representative position of the mark 201, the template matching is performed between the inverted reference image and the right divided image. Therefore, the distance between the patterns in the vertical direction is calculated based on the horizontal correlation image 512 and the distance between the patterns in the horizontal direction is calculated based on the vertical correlation image 522. Accordingly, a correlation image can be calculated by performing the template matching between the reference image 402 and the right divided image 404 and both the distances between the patterns in the vertical direction and the horizontal direction can be calculated from the correlation image.

4) Determination of Whether Shape of Pattern Detected in ROI Window Matches Shape of Pattern of Mark 201

Finally, it is determined whether the shape of the pattern in the ROI window 301 matches the shape of the pattern of the mark (step S113). This determination condition is a determination condition for preventing erroneous detection due to a shape of a structure on the semiconductor wafer accidentally having the same positional relationship as the pattern set as the alignment mark although the shape of the structure on the semiconductor wafer is not set as the alignment mark. In this determination, any divided images may be used. For example, it is possible to apply a scheme of performing preprocessing on the left divided image, extracting a contour line of the pattern, obtaining a shape, an area, or the like of the extracted contour line, and determining whether the shape, the area, or the like matches the pattern of the mark 201. The determination scheme is not limited to the determination based on the contour line. The patterns may not be completely matched, but may be matched within a certain range in consideration of a variation in the pattern, a variation in imaging magnification, or the like.

When all the foregoing four determination conditions are positive, it can be determined that the mark 201 is in the ROI window 301. Next, a method of calculating the representative position 203 of the mark 201 in the ROI window 301 from the horizontal correlation image 512 and the vertical correlation image 522 (step S115) will be described.

The representative position 203 of the mark 201 is calculated not by directly obtaining the representative position 203 of the mark 201 but by calculating a distance between the representative position 203 of the mark 201 and the central position 405 of the ROI window 301.

As described above, when the position of the pattern 501 in the left divided image 403 and the position of the pattern 502 in the right divided image 404 are at the same position in this example and the central position of the reference image (the template image) matches the central position of the right divided image 404 (the searching target image), a correlation value between the center 516 of the horizontal correlation image 512 and the center 526 of the vertical correlation image 522 becomes the maximum.

In FIG. 5A, however, the representative position 203 of the mark 201 deviates to the left from the central position 405 of the ROI window 301. A distance deviating to the left is assumed to −Δx. As illustrated in FIG. 5B, the cut reference image 402 is horizontally inverted with respect to the vertical axis, and thus the pattern of the horizontally inverted reference image 511 deviates by Δx to the right (a distance Δx deviating to the right is denoted by +Δx). When the template matching is performed between the reference image (the horizontally inverted reference image) in which the pattern deviates by +Δx in the horizontal direction and the divided image 404 in which the pattern deviates-Ax from the central position 405 of the ROI window 301, a coincident position of both the images deviates in the horizontal direction by −Δ2x from a coincident position in a case where the position of the pattern 501 in the left divided image 403 and the position of the pattern 502 in the right divided image 404 are the same position. That is, the distance between the representative position 203 of the mark 201 and the central position 405 of the ROI window 301 in the horizontal direction (the X direction) can be calculated as a half of a distance 514 between the maximum brightness point 513 of the horizontal correlation image 512 and the center 516 of the horizontal correlation image 512 in the horizontal direction (the X direction).

Similarly, a distance between the representative position 203 of the mark 201 and the central position 405 of the ROI window 301 in the vertical direction (the Y direction) can be calculated as a half of a distance 525 between the maximum brightness point 523 of the vertical correlation image 522 and the center 526 of the vertical correlation image 522 in the vertical direction (the Y direction).

In this way, the distances from the central position 405 of the ROI window 301 in the horizontal direction (the X direction) and the vertical direction (the Y direction) including orientations (the right, the left, the top, and the bottom) can be calculated. Therefore, coordinates of the representative position 203 of the mark 201 can be estimated with high accuracy from coordinates of the central position 405 of the ROI window 301.

Embodiment 2

In Embodiment 2, a method of specifying an alignment mark used commonly in an alignment process will be described. An alignment mark according to Embodiment 2 include three identical patterns, as illustrated in FIG. 6.

FIG. 9 is a flowchart illustrating the alignment process according to Embodiment 2. Hereinafter, an overview of each step will be described.
(Step S901)
The calculation processing unit 1007 acquires an image obtained by imaging the semiconductor wafer by the captured image input unit 1011. It is assumed that an alignment mark is shown in the image. Features of the alignment mark used in Embodiment 2 will be described below with reference to FIG. 6.
(Step S902)
The alignment processing unit 1012 sets an ROI window in the acquired image. The ROI window will be described below with reference to FIG. 7.
(Steps S903 to S904)
The alignment processing unit 1012 determines whether the alignment mark is in the ROI window. When the alignment mark is determined to be in the ROI window, the alignment processing unit 1012 attempts to calculate the representative position of the alignment mark. This process is repeated while moving (scanning) the ROI window until the process succeeds. When the scanning is completed in the entire region of the image, the alignment process ends.
(Steps S905 to S918)
The steps are a procedure of determining whether the alignment mark is in the ROI window. The details of the procedure will be described with reference to FIGS. 8A to 8D. When the alignment mark is determined to be in the ROI window, the process proceeds to step S919. When the alignment mark is determined not to be in the ROI window, the ROI window is moved (step S903) and it is repeatedly determined whether the alignment mark is in a new image region of the ROI window.
(Step S919)
The alignment processing unit 1012 calculates the representative position of the mark. The details of the representative position will be described below with reference to FIGS. 8A to 8D.

Hereinafter, details of each step will be described. Here, common portions to those of Embodiment 1 are denoted by the same reference numerals and description of the common portions will be omitted and repeated description of common procedures will be omitted.

FIG. 6 is an image 200 obtained by imaging a semiconductor wafer and input to an alignment processing apparatus. In the image 200, an alignment mark 601 is shown. The alignment processing apparatus accurately obtains a representative position 605 of the mark 601 in the image 200. The inspection apparatus accurately specifies a position of an inspection point 202 based on the position and performs inspection. The mark 601 includes three patterns 602 to 604. The three patterns have an identical shape and a shape of each pattern is a shape satisfying the same requirements as those of Embodiment 1 (the patterns 501 and 502).

Here, in a positional relationship among three patterns of the mark 601, coordinates of the patterns 602 and 603 in the vertical direction (the Y direction) are the same and coordinates of the patterns 602 and 604 in the horizontal direction are the same. An X coordinate of the representative position 605 of the mark 601 is an X coordinate of a middle point between the center of the pattern 602 and the center of the pattern 603, and a Y coordinate of the representative position 605 is a Y coordinate of a middle point between the center of the pattern 602 and the center of the pattern 604. In this way, when the representative position 605 of the mark 601 can be defined, relative positions of the three patterns 602 to 604 of the mark 601 are not limited to the relative positions illustrated in FIG. 6.

A broken line indicating the mark 601 illustrated in FIG. 6 and a dotted line connecting a point of the representative position 605 or a central point of a pattern are shown in the drawing to describe the mark 601 and the representative position 605 of the mark 601 explicitly, but are not actually shown in an actual semiconductor wafer or the image 200.

The mark 601 can be considered as a combination of the patterns 602 and 603 disposed to be point-symmetric and the patterns 602 and 604 disposed to be point-symmetric. Accordingly, the representative position of the mark 601 can also be calculated as in Embodiment 1.

As in Embodiment 1, the alignment processing unit 1012 sets an ROI window 301 and scans the image 200 (steps S902 and S903). The alignment processing unit 1012 determines whether the mark 601 is in the ROI window 301. When the mark 601 is determined to be in the ROI window 301, the representative position 605 of the mark 601 is calculated.

FIG. 7 is a diagram illustrating a division index for dividing the ROI window 301 and a reference image. The alignment processing unit 1012 divides the ROI window 301 into four image regions (a top left divided image 703, a top right divided image 704, a bottom left divided image 705, and a bottom right divided image 706) using a first division index 701 and a second division index 702 (step S905). Here, the first division index 701 and the second division index 702 are respectively set as a vertical line (parallel to the Y axis) and a horizontal line (parallel to the X axis) passing through a central position 708 of the ROI window 301. The division indices 701 and 702 may not necessarily pass through the central position 708 of the ROI window 301, but can pass through the central position 708 as in Embodiment 1, so that a calculation load on the alignment process can be reduced.

Of the four divided images 703 to 706, a smaller image region is cut from any one image region (assumed to be the top left divided image 703 here) where there is a pattern and is set as a reference image 707 (step S906). Here, a central position of the reference image 707 is set to match a central position of the divided image 703. Accordingly, a calculation load on the alignment process can be reduced.

FIG. 8A is a diagram illustrating a state in which the ROI window 301 is moved to the vicinity of the mark 601. In the example of FIG. 8A, the representative position 605 of the mark 601 slightly deviates from a central position 708 of the ROI window 301.

FIG. 8B is a diagram illustrating a calculation procedure of a first horizontal correlation image 812 and a first vertical correlation image 822 from an image of the ROI window 301 illustrated in FIG. 8A. The first horizontal correlation image 812 is a correlation image that can be obtained by setting an image obtained by inverting the reference image 707 with reference to the vertical axis (the Y axis) as a horizontally inverted reference image 811 (step S907) and performing template matching on the horizontally inverted reference image 811 and the top right divided image 704 (step S909). The first vertical correlation image 822 is a correlation image that can be obtained by setting an image obtained by inverting the reference image 707 with reference to the horizontal axis (the X axis) as a vertically inverted reference image 821 (step S908) and performing template matching on the vertically inverted reference image 821 and the top right divided image 704 (step S910).

FIG. 8C is a diagram illustrating a calculation procedure of a second horizontal correlation image 832 and a second vertical correlation image 842 from an image of the ROI window 301 illustrated in FIG. 8A. The second horizontal correlation image 832 is a correlation image that can be obtained by performing the template matching on the horizontally inverted reference image 811 and the bottom left divided image 705 (step S912). The second vertical correlation image 842 is a correlation image that can be obtained by performing the template matching on the vertically inverted reference image 821 and the bottom left divided image 705 (step S913).

FIG. 8D is a diagram illustrating a calculation procedure of a correlation image 852. The correlation image 852 is a correlation image that can be obtained by performing the template matching on the reference image 707 and the bottom right divided image 706 (step S915).

Next, a procedure of determining whether the mark 601 is in the ROI window 301 (step S918) will be described.

This determination procedure includes determination for the following three determination conditions. The three determination conditions are 1) determination of whether an identical pattern is in four divided images of the ROI window at a predetermined disposition, 2) determination for distances between three patterns in the vertical direction and the horizontal direction, and 3) determination of whether a shape of a pattern detected in the ROI window matches a shape of the pattern of the mark 601.

1) Determination of Whether Identical Pattern is in Four Divided Images of ROI Window at Predetermined Disposition This determination includes first determination in which an identical pattern is determined to be between the top left divided image 703 and the top right divided image 704, second determination in which an identical pattern is determined to be between the top left divided image 703 and the bottom left divided image 705, and third determination in which an identical pattern is determined not to be between the top left divided image 703 and the bottom right divided image 706, and a condition for clearing this determination is that the first to third determinations are all positive.

In the first determination, it is determined whether a brightness value of a maximum brightness point 813 (823)

of the first horizontal correlation image 812 (or the first vertical correlation image 822) exceeds preset threshold 1 (a determination reference). In the second determination, it is determined whether a brightness value of a maximum brightness point 833 (843) of the second horizontal correlation image 832 (or the second vertical correlation image 842) exceeds preset threshold 2 (a determination reference). In the third determination, it is determined whether a brightness value of a maximum brightness point 853 of the correlation image 852 exceeds preset threshold 3 (a determination reference) (step S916). As thresholds 1, 2, and 3, the same value may be set or different values may be set.

2) Determination for Distances Between Three Patterns in Vertical Direction and Horizontal Direction As described in Embodiment 1, a distance between a pattern 602*a* in the top left divided image 703 and a pattern 603*a* in the top right divided image 704 in the vertical direction (the Y direction) is a distance between the maximum brightness point 813 of the first horizontal correlation image 812 and the center 816 of the first horizontal correlation image 812 in the vertical direction (the Y direction). Similarly, the distance in the horizontal direction (the X direction) can be obtained from a distance between the maximum brightness point 823 of the first vertical correlation image 822 and the center 826 of the first vertical correlation image 822 in the horizontal direction (the X direction) (step S911).

It is determined whether the distance in the vertical direction (the Y direction) obtained in this way is 0 and the distance in the horizontal direction (X direction) is the same as the distance between the pattern 602 and the pattern 603 in the mark 601 in the horizontal direction (the X direction).

Similarly, a distance between the pattern 602*a* in the top left divided image 703 and a pattern 604*a* in the bottom left divided image 705 in the vertical direction (the Y direction) can be obtained from a distance between a maximum brightness point 843 of the second horizontal correlation image 832 and the center 836 of the second horizontal correlation image in the vertical direction (the Y direction). A distance between the pattern 602*a* in the top left divided image 703 and the pattern 604*a* in the bottom left divided image 705 in the horizontal direction (the X direction) is a distance between the maximum brightness point 843 of the second vertical correlation image 842 and the center 846 of the second vertical correlation image in the horizontal direction (the X direction) (step S914).

It is determined whether the distance in the vertical direction (the Y direction) obtained in this way is the same as the distance between the patterns 602 and 604 in the mark 601 in the vertical direction (the Y direction) and the distance in the horizontal direction (the X direction) is 0.

3) Determination of Whether Shape of Pattern Detected in ROI Window Matches Shape of Pattern of Mark 601

Finally, it is determined whether the shape of the pattern in the ROI window 301 matches the shape of the pattern of the mark (step S917). In this determination, any divided image in which there is a pattern may be used. A determination method is similar to that of Embodiment 1.

When all the foregoing three determination conditions are positive, it can be determined that the mark 601 is in the ROI window 301. Next, a method of calculating the representative position 605 of the mark 601 in the ROI window 301 (step S919) will be described. In Embodiment 2, the representative position 605 of the mark 601 is calculated by calculating a distance between the representative position 605 of the mark 601 and the central position 708 of the ROI window 301.

The distance between the representative position 605 of the mark 601 and the central position 708 of the ROI window 301 in the horizontal direction (the X direction) is calculated from the first horizontal correlation image 812 as in Embodiment 1. Specifically, the distance can be calculated as a half of a distance between the maximum brightness point 813 of the first horizontal correlation image 812 and the center 816 of the first horizontal correlation image 812 in the horizontal direction (the X direction).

Similarly, the distance between the representative position 605 of the mark 601 and the central position 708 of the ROI window 301 in the vertical direction (the Y direction) is calculated from the second vertical correlation image 842 as in Embodiment 1. Specifically, the distance can be calculated as a half of a distance between the maximum brightness point 843 of the second vertical correlation image 842 and the center 846 of the second vertical correlation image 842 in the vertical direction (Y direction).

The details of the alignment process have been described above according to two embodiments.

In this way, the alignment process can be performed without a template image prepared in advance for the alignment process. Therefore, even when a way to view a pattern is considerably different between steps, the alignment process can be performed stably with high accuracy. Since a template image is not necessary, a procedure of generating an inspection recipe of an operator can also be simplified. As described above, when an alignment mark is roughly entered within the ROI window, the representative position of the mark can be calculated. Therefore, since a scanning interval of the ROI window (a searching interval) can be set to be large, the alignment process can be performed at a high speed.

The alignment process according to the present disclosure is not limited to application to the alignment process of an inspection apparatus. According to the present disclosure, it is possible to acquire an image available as a template image at a high speed and with high accuracy. Therefore, the alignment process can also be used in the inspection recipe generation apparatus.

FIG. 11 is a diagram illustrating a configuration example of an inspection recipe generation apparatus that generates an inspection recipe used for an inspection apparatus to inspect a semiconductor wafer. An inspection recipe indicates an inspection condition and includes, for example, coordinate (inspection position) of an inspection pattern necessary for inspection, a type of pattern, and an imaging condition (an optical condition or a movement condition of a stage). In the related art, when an inspection recipe is generated, an operator cuts an image region where a mark is shown from an image prepared in advance and registers the image region as the template image. According to the present disclosure, by automating generation of a template image, it is possible to reduce a burden on the generation of the template image by the operator.

The computer system 1003 functions as a captured image input unit 1011 that is an interface to which a captured image is input, an alignment processing unit 1012 that performs an alignment process on an image input by the captured image input unit 1011, and an inspection recipe generation unit 1111 that is an interface to which an inspection condition registered as an inspection recipe is input by an operator and registers the input inspection condition in a predetermined format. In an image storage medium 1101, for example, in a predetermined step of generating an inspection recipe, an image of a semiconductor wafer which is an inspection target captured with an optical microscope is accumulated.

An image at a mark position extracted by the alignment processing unit 1012 (for example, an ROI window when a mark is detected appropriately) is cut and is registered as a template image in an inspection recipe.

REFERENCE SIGNS LIST

200: Image
201: Alignment mark
202: Inspection point
203: Representative position
301: ROI window
401: Division index
402: Reference image
403: Left divided image
404: Right divided image
405: Central position
501, 502: Pattern
511: Horizontally inverted reference image
512: Horizontal correlation image
513, 523: Maximum brightness point
514, 515, 524, 525: Distance
516, 526: Center
521: Vertically inverted reference image
522: Vertical correlation image
601: Alignment mark
602, 603. 604: Pattern
605: Representative position
701: First division index
702: Second division index
703: Top left divided image
704: Top right divided image
705: Bottom left divided image
706: Bottom right divided image
707: Reference image
708: Central position
811: Horizontally inverted reference image
812: First horizontal correlation image
813, 823, 833, 843, 853: Maximum brightness point
814, 824, 834, 844: Distance
816, 826, 836, 846: Center
821: Vertically inverted reference image
822: First vertical correlation image
832: Second horizontal correlation image
842: Second vertical correlation image
852: Correlation image
1001: SEM body
1002: Control device
1003: Computer system
1007: Calculation processing unit
1008: Storage device
1010: Inspection position specification unit
1011: Captured image input unit
1012: Alignment processing unit
1030: Input device
1031: Display
1101: Image storage medium
1111: Inspection recipe generation unit

The invention claimed is:

1. A position specification method of specifying a position of a mark formed on a semiconductor wafer from an image of the semiconductor wafer using a computer system, wherein the mark has at least a first pattern and a second pattern, and the first and second patterns have an identical shape which is line-symmetric with respect to a first axis and a second axis that are orthogonal to each other, the first and second patterns being disposed to be point-symmetric, wherein the position specification method comprises:

a first procedure of setting a partial image region in the image;

a second procedure of dividing the partial image region into a first divided image and a second divided image based on a division index and setting a partial region of the first divided image as a reference image;

a third procedure of determining whether the mark is in the partial image region; and a fourth procedure of calculating a representative position of the mark in the partial image region when the mark is determined to be in the partial image region in the third procedure and calculating the representative position of the mark in the image based on a position of the partial image region in the image and the calculated representative position of the mark in the partial image region, and wherein, in the third and fourth procedures, it is determined whether the mark is in the partial image region and the representative position of the mark in the partial image region is calculated based on a template matching result obtained by performing template matching between a template image which is based on the reference image and the second divided image which is a searching target image, wherein in the third procedure, first determination is performed to determine whether the second divided image includes an identical pattern to the first divided image, second determination is performed to determine whether a distance between a pattern included in the first divided image and a pattern included in the second divided image is equal to a distance between the first pattern and the second pattern in the mark, and third determination is performed to determine whether a shape of a pattern included in the partial image region matches the first pattern, and the mark is determined to be in the partial image region when the first to third determinations are positive.

2. The position specification method according to claim 1, wherein, in the fourth procedure, the representative position of the mark in the partial image region is calculated based on a first template matching result obtained by setting a first inverted reference image inverted from the reference image with respect to an axis parallel to the first axis as the template image and setting the second divided image as a searching target image and a second template matching result obtained by setting a second inverted reference image inverted from the reference image with respect to an axis parallel to the second axis as the template image and setting the second divided image as a searching target image.

3. The position specification method according to claim 1, wherein, in the third procedure, the first determination is performed based on a brightness value of a maximum brightness point in the template matching result, and the maximum brightness point is obtained in units of sub-pixels.

4. The position specification method according to claim 1, wherein, in the third procedure, the second determination is performed based on a first template matching result obtained by setting a first inverted reference image inverted from the reference image with respect to an axis parallel to the first axis as the template image and setting the second divided image as a searching target image and a second template matching result obtained by setting a second inverted reference image inverted from the reference image with respect to an axis parallel to the second axis as the template image and setting the second divided image as a searching target image, wherein, in the third procedure, the first determination is performed based on the first template matching result and the second template matching result, and wherein, in the fourth procedure, the representative position of the mark in the partial image region is calculated based on the first template matching result and the second template matching result.

5. The position specification method according to claim 1, wherein, in the second procedure, the division index is set to pass through a center of the partial image region and a center of the reference image is set to match a center of the first divided image.

6. A position specification method of specifying a position of a mark formed on a semiconductor wafer from an image of the semiconductor wafer using a computer system, wherein the mark has at least a first pattern and a second pattern, and the first and second patterns have an identical shape which is line-symmetric with respect to a first axis and a second axis that are orthogonal to each other, the first and second patterns being disposed to be point-symmetric, wherein the position specification method comprises:

a first procedure of setting a partial image region in the image;

a second procedure of dividing the partial image region into a first divided image and a second divided image based on a division index and setting a partial region of the first divided image as a reference image;

a third procedure of determining whether the mark is in the partial image region; and a fourth procedure of calculating a representative position of the mark in the partial image region when the mark is determined to be in the partial image region in the third procedure and calculating the representative position of the mark in the image based on a position of the partial image region in the image and the calculated representative position of the mark in the partial image region, and wherein, in the third and fourth procedures, it is determined whether the mark is in the partial image region and the representative position of the mark in the partial image region is calculated based on a template matching result obtained by performing template matching between a template image which is based on the reference image and the second divided image which is a searching target image, wherein, in the first procedure, the partial image region is set while being moved in a first direction parallel to the first axis and/or a second direction parallel to the second axis with respect to the image, and wherein a movement amount of the partial image region in the first direction and/or the second direction corresponds to a plurality of pixels.

7. The position specification method according to claim 1, wherein the representative position of the mark is centered on symmetry of the first pattern and the second pattern disposed to be point-symmetric.

8. A non-transitory computer-readable storage medium storing instructions for specifying a position of a mark formed on a semiconductor wafer from an image of the semiconductor wafer using a computer system, wherein the mark has at least a first pattern and a second pattern, and the first and second patterns have an identical shape which is line-symmetric with respect to a first axis and a second axis that are orthogonal to each other, the first and second patterns being disposed to be point-symmetric, wherein when executed by a processors of the computing system, the instructions cause the computing system to execute:

a first procedure of setting a partial image region in the image;

a second procedure of dividing the partial image region into a first divided image and a second divided image based on a division index and setting a partial region of the first divided image as a reference image;

a third procedure of determining whether the mark is in the partial image region; and a fourth procedure of calculating a representative position of the mark in the partial image region when the mark is determined to be in the partial image region in the third procedure and calculating the representative position of the mark in the image based on a position of the partial image region in the image and the calculated representative position of the mark in the partial image region, and wherein, in the third and fourth procedures, it is determined whether the mark is in the partial image region and the representative position of the mark in the partial image region is calculated based on a template matching result obtained by performing template matching between a template image which is based on the reference image and the second divided image which is a searching target image, wherein in the third procedure, first determination is performed to determine whether the second divided image includes an identical pattern to the first divided image, second determination is performed to determine whether a distance between a pattern included in the first divided image and a pattern included in the second divided image is equal to a distance between the first pattern and the second pattern in the mark, and third determination is performed to determine whether a shape of a pattern included in the partial image region matches the first pattern, and the mark is determined to be in the partial image region when the first to third determinations are positive.

9. An inspection apparatus inspecting a pattern formed on a semiconductor wafer, the inspection apparatus comprising:

a computer system specifying an inspection position of the semiconductor wafer from an image of the semiconductor wafer, wherein the computer system includes an alignment processing program specifying a position of a mark formed on the semiconductor wafer and an inspection position specification program specifying the inspection position on the semiconductor wafer from a representative position of the mark specified by the alignment processing program, wherein the mark has at least a first pattern and a second pattern, and the first and second patterns have an identical shape which is line-symmetric with respect to a first axis and a second axis that are orthogonal to each other, the first and second patterns being disposed to be point-symmetric, wherein the computer system executes the alignment processing program to perform a first procedure of setting a partial image region in the image, a second procedure of dividing the partial image region into a first divided image and a second divided image based on a division index and setting a partial region of the first divided image as a reference image, a third procedure of determining whether the mark is in the partial image region, and a fourth procedure of calculating a representative position of the mark in the partial image region when the mark is determined to be in the partial image region in the third procedure and calculating the representative position of the mark in the image based on a position of the partial image region in the image and the calculated representative position of the mark in the partial image region, and wherein, in the third and fourth procedures, it is determined whether the mark is in the partial image region and the representative position of the mark in the partial image region is calculated based on a template matching result obtained by performing template matching between a template image which is based on the reference image and the second divided image which is a searching target image, wherein, in the third procedure, the computer system performs first determination to determine whether the second divided image includes an identical pattern to the first divided image, performs second determination to determine whether a distance between a pattern included in the first divided image and a pattern included in the second divided image is equal to a distance between the first pattern and the second pattern in the mark, and performs third determination to determine whether a shape of a pattern included in the partial image region matches the first pattern, and determines that the mark is in the partial image region when the first to third determinations are positive.

10. The inspection apparatus according to claim 9, wherein, in the fourth procedure, the computer system calculates the representative position of the mark in the partial image region based on a first template matching result obtained by setting a first inverted reference image inverted from the reference image with respect to an axis parallel to the first axis as the template image and setting the second divided image as a searching target image and a second template matching result obtained by setting a second inverted reference image inverted from the reference image with respect to an axis parallel to the second axis as the template image and setting the second divided image as a searching target image.

11. The inspection apparatus according to claim 9, wherein, in the third procedure performed by the computer system, the first determination is performed based on a brightness value of a maximum brightness point in the template matching result, and the maximum brightness point is obtained in units of sub-pixels.

12. An inspection apparatus inspecting a pattern formed on a semiconductor wafer, the inspection apparatus comprising:

a computer system specifying an inspection position of the semiconductor wafer from an image of the semiconductor wafer, wherein the computer system includes an alignment processing program specifying a position of a mark formed on the semiconductor wafer and an inspection position specification program specifying the inspection position on the semiconductor wafer from a representative position of the mark specified by the alignment processing program, wherein the mark has at least a first pattern and a second pattern, and the first and second patterns have an identical shape which is line-symmetric with respect to a first axis and a second axis that are orthogonal to each other, the first and second patterns being disposed to be point-symmetric, wherein the computer system executes the alignment processing program to perform a first procedure of setting a partial image region in the image, a second procedure of dividing the partial image region into a first divided image and a second divided image based on a division index and setting a partial region of the first divided image as a reference image, a third procedure of determining whether the mark is in the partial image region, and a fourth procedure of calculating a representative position of the mark in the partial image region when the mark is determined to be in the partial image region in the third procedure and calculating the representative position of the mark in the image based on a position of the partial image region in the image and the calculated representative position of the mark in the partial image region, and wherein, in the third and fourth procedures, it is determined whether the mark is in the partial image region and the representative position of the mark in the partial image region is calculated based on a template matching result obtained by performing template matching between a template image which is based on the reference image and the second divided image which is a searching target image, wherein, in the first procedure, the computer system sets the partial image region while moving the partial image region in a first direction parallel to the first axis and/or a second direction parallel to the second axis with respect to the image, and wherein a movement amount of the partial image region in the first direction and/or the second direction corresponds to a plurality of pixels.

13. An inspection apparatus inspecting a pattern formed on a semiconductor wafer, the inspection apparatus comprising:

a computer system specifying an inspection position of the semiconductor wafer from an image of the semiconductor wafer, wherein the computer system includes an alignment processing program specifying a position of a mark formed on the semiconductor wafer and an inspection position specification program specifying the inspection position on the semiconductor wafer from a representative position of the mark specified by the alignment processing program, wherein the mark has at least a first pattern and a second pattern, and the first and second patterns have an identical shape which is line-symmetric with respect to a first axis and a second axis that are orthogonal to each other, the first and second patterns being disposed to be point-symmetric, wherein the computer system executes the alignment processing program to perform a first procedure of setting a partial image region in the image, a second procedure of dividing the partial image region into a first divided image and a second divided image based on a division index and setting a partial region of the first divided image as a reference image, a third procedure of determining whether the mark is in the partial image region, and a fourth procedure of calculating a representative position of the mark in the partial image region when the mark is determined to be in the partial image region in the third procedure and calculating the representative position of the mark in the image based on a position of the partial image region in the image and the calculated representative position of the mark in the partial image region, and wherein, in the third and fourth procedures, it is determined whether the mark is in the partial image region and the representative position of the mark in the partial image region is calculated based on a template matching result obtained by performing template matching between a template image which is based on the reference image and the second divided image which is a searching target image, wherein the computer system stores a positional relationship between the representative position of the mark and the inspection position in the semiconductor wafer, and wherein the computer system executes the inspection position specification program to specify the inspection position on the semiconductor wafer based on a positional relationship between a representative position of the mark specified by the alignment processing program, the representative position of the mark, and the inspection position.

* * * * *